US012730372B2

(12) United States Patent
Joshi et al.

(10) Patent No.: US 12,730,372 B2

(45) **Date of Patent: *Sep. 8, 2026**

(54) IMPRINT COMPOSITIONS WITH PASSIVATED NANOPARTICLES AND MATERIALS AND PROCESSES FOR MAKING THE SAME

(71) Applicant: Applied Materials, Inc., Santa Clara, CA (US)

(72) Inventors: Amita Joshi, Fremont, CA (US); Andrew Ceballos, Palo Alto, CA (US); Kenichi Ohno, Sunnyvale, CA (US); Rami Hourani, Santa Clara, CA (US); Ludovic Godet, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 238 days.

This patent is subject to a terminal disclaimer.

(21) Appl. No.: 18/521,853

(22) Filed: Nov. 28, 2023

(65) Prior Publication Data

US 2024/0094630 A1 Mar. 21, 2024

Related U.S. Application Data

(62) Division of application No. 17/527,819, filed on Nov. 16, 2021, now Pat. No. 11,868,043.

(60) Provisional application No. 63/115,440, filed on Nov. 18, 2020.

(51) Int. Cl.

*C09D 7/65* (2018.01)
*C09D 7/40* (2018.01)
*C09D 7/62* (2018.01)
*G03F 7/00* (2006.01)
*G03F 7/16* (2006.01)

(52) U.S. Cl.

CPC ............. *G03F 7/0002* (2013.01); *C09D 7/62* (2018.01); *C09D 7/65* (2018.01); *C09D 7/67* (2018.01); *G03F 7/167* (2013.01)

(58) Field of Classification Search

CPC ...... G03F 7/0002; G03F 7/167; G03F 7/0047; G03F 7/032; G03F 7/033; G03F 7/0775; C09D 7/62; C09D 7/65; C09D 7/67; C09D 7/70; C08K 3/22; C08K 9/02; C08K 9/08; C23C 16/40; C23C 16/4555

USPC .......................................................... 264/241

See application file for complete search history.

(56) References Cited

U.S. PATENT DOCUMENTS

| | | | |
|---|---|---|---|
| 7,229,690 B2 | 6/2007 | Chan et al. | |
| 7,253,119 B2 | 8/2007 | Dutta | |
| 7,563,457 B2 | 7/2009 | Cha et al. | |
| 8,263,129 B2 | 9/2012 | DeSimone et al. | |
| 8,420,124 B2 | 4/2013 | DeSimone et al. | |
| 8,465,775 B2 | 6/2013 | DeSimone et al. | |
| 8,685,461 B2 | 4/2014 | Rothrock et al. | |
| 8,992,992 B2 | 3/2015 | DeSimone et al. | |
| 9,040,090 B2 | 5/2015 | DeSimone et al. | |
| 9,214,590 B2 | 12/2015 | DeSimone et al. | |
| 9,381,158 B2 | 7/2016 | DeSimone et al. | |
| 9,675,953 B2 | 6/2017 | Oldenburg et al. | |
| 9,724,305 B2 | 8/2017 | DeSimone et al. | |
| 9,877,920 B2 | 1/2018 | DeSimone et al. | |
| 9,902,818 B2 | 2/2018 | DeSimone et al. | |
| 10,517,824 B2 | 12/2019 | DeSimone et al. | |
| 10,842,748 B2 | 11/2020 | DeSimone et al. | |
| 11,041,071 B2 | 6/2021 | Tangirala et al. | |
| 12,044,963 B2 * | 7/2024 | Joshi | B29C 71/04 |
| 2005/0255237 A1 | 11/2005 | Zhang et al. | |
| 2007/0221939 A1 * | 9/2007 | Taskar | C08L 83/04 257/E33.059 |
| 2007/0264481 A1 | 11/2007 | DeSimone et al. | |
| 2008/0181958 A1 | 7/2008 | Rothrock et al. | |
| 2009/0028910 A1 | 1/2009 | DeSimone et al. | |
| 2009/0061152 A1 | 3/2009 | DeSimone et al. | |
| 2009/0220789 A1 | 9/2009 | DeSimone et al. | |
| 2010/0028994 A1 | 2/2010 | DeSimone et al. | |
| 2010/0147365 A1 | 6/2010 | DeSimone et al. | |
| 2011/0182805 A1 | 7/2011 | DeSimone et al. | |
| 2013/0084442 A1 | 4/2013 | Akutagawa et al. | |
| 2013/0177598 A1 | 7/2013 | Desimone et al. | |
| 2013/0249138 A1 | 9/2013 | DeSimone et al. | |

(Continued)

FOREIGN PATENT DOCUMENTS

| | | |
|---|---|---|
| CN | 108699430 | 10/2018 |
| CN | 108699430 A | 10/2018 |

(Continued)

OTHER PUBLICATIONS

Extended European Search Report dated Sep. 19, 2024 for Application No. 21895444.4.

(Continued)

*Primary Examiner* — Hannah J Pak

(74) *Attorney, Agent, or Firm* — Patterson + Sheridan, LLP

(57) ABSTRACT

Embodiments of the present disclosure generally relate to imprint compositions and materials and related processes useful for nanoimprint lithography (NIL). In one or more embodiments, an imprint composition is provided and contains a plurality of passivated nanoparticles, one or more solvents, a surface ligand, an additive, and an acrylate. Each passivated nanoparticle contains a core and one or more shells, where the core contains one or more metal oxides and the shell contains one or more passivation materials. The passivation material of the shell contains one or more silicon-containing compounds.

20 Claims, 2 Drawing Sheets

(56) References Cited

U.S. PATENT DOCUMENTS

| | | | |
|---|---|---|---|
| 2013/0336884 | A1 | 12/2013 | DeSimone et al. |
| 2013/0344118 | A1 | 12/2013 | Rothrock et al. |
| 2014/0072632 | A1 | 3/2014 | DeSimone et al. |
| 2014/0072720 | A1 | 3/2014 | Watkins et al. |
| 2015/0280222 | A1 | 10/2015 | Kirkengen |
| 2015/0283079 | A1 | 10/2015 | DeSimone et al. |
| 2015/0307669 | A1 | 10/2015 | DeSimone et al. |
| 2016/0038418 | A1 | 2/2016 | DeSimone et al. |
| 2016/0250612 | A1* | 9/2016 | Oldenburg ............... B01J 13/20 428/404 |
| 2016/0303049 | A1 | 10/2016 | DeSimone et al. |
| 2018/0116959 | A1 | 5/2018 | DeSimone et al. |
| 2018/0273656 | A1 | 9/2018 | Takagi et al. |
| 2019/0091950 | A1 | 3/2019 | Hernandez Rueda et al. |
| 2019/0243237 | A1 | 8/2019 | Watkins et al. |
| 2020/0078301 | A1 | 3/2020 | Desimone et al. |
| 2020/0089073 | A1 | 3/2020 | Koo |
| 2020/0249568 | A1 | 8/2020 | Rao et al. |
| 2020/0285145 | A1 | 9/2020 | Watkins et al. |
| 2021/0059940 | A1 | 3/2021 | Desimone et al. |
| 2021/0223686 | A1 | 7/2021 | Joshi et al. |
| 2022/0155678 | A1 | 5/2022 | Joshi et al. |

FOREIGN PATENT DOCUMENTS

| | | | |
|---|---|---|---|
| CN | 114846403 | A | 8/2022 |
| JP | 2005527110 | A | 9/2005 |
| JP | 2010208911 | A | 9/2010 |
| JP | 2011170073 | A | 9/2011 |
| JP | 2011187824 | A | 9/2011 |
| JP | 2011221365 | A | 11/2011 |
| JP | 2016074870 | A | 5/2016 |
| JP | 2016109983 | A | 6/2016 |
| JP | 2019053304 | A | 4/2019 |
| JP | 2020132857 | A | 8/2020 |
| TW | I867258 | | 12/2024 |
| WO | 2020180718 | A1 | 9/2020 |
| WO | 2021150311 | A1 | 7/2021 |

OTHER PUBLICATIONS

Cian Cummins et al: "Strategies for Inorganic Incorporation using Neat Block Copolymer Thin Films for Etch Mask Function and Nanotechnological Application", Advanced Materials, VCH Publishers, DE, vol. 28, No. 27, Jan. 8, 2016 (Jan. 8, 2016), pp. 5586-561 B. XP071 870892. ISSN: 0935-9648. DOI:'1 0.1 002/ ADMA.201 503432.

1 Taiwan Office Action dated Jan. 10, 2025 for Application No. 113133237 (APPM/44018775TWD01).

Notice of Observation dated Mar. 19, 2024.

Taiwan Office Action dated Jun. 13, 2024 for Application No. 110142889.

Taiwanese Office Action for Application No. 114112272 mailed Jul. 9, 2025.

Korean Office Action for Application No. 10-2023-7020247 mailed Jul. 21, 2025.

Japanese Office Action for Application No. 2023-529979 mailed Aug. 26, 2025.

International Search Report and Written Opinion dated Mar. 8, 2022 for Application No. PCT/US2021/059508.

Taiwan Office Action dated Sep. 7, 2022 for Application No. 110142889.

Taiwan Office Action dated Apr. 12, 2023 for Application No. 110142889.

Chinese Office Action for Application No. 202180082465.4 dated Apr. 24, 2026.

* cited by examiner

IMPRINT COMPOSITIONS WITH PASSIVATED NANOPARTICLES AND MATERIALS AND PROCESSES FOR MAKING THE SAME

CROSS-REFERENCE TO RELATED APPLICATIONS

This application is a divisional of U.S. application Ser. No. 17/527,819, filed on Nov. 16, 2021, which claims benefit to U.S. Prov. Appl. No. 63/115,440, filed on Nov. 18, 2020, which are herein incorporated by reference in their entirety.

BACKGROUND

Field

Embodiments of the present disclosure generally relate to microelectronic processing, and more specifically to imprint compositions and materials and related processes useful for nanoimprint lithography (NIL).

Description of the Related Art

Nano and micro-patterning of nanoparticle imprint provides opportunities for developing nanomaterial-based electronics, energy devices, sensors, and other types of devices with nanometer scale resolution. The imprint materials currently available contain either organic (high index polymers) or inorganic-organic hybrid materials (sol-gel). The majority of the imprint materials have low refractive index (<1.7), along with multiple problems associated with optical transparency in visible region, optical resolution, processability, high shrinkage of imprinted features and cost effectiveness.

Therefore, improved imprint compositions and materials and related processes are needed.

SUMMARY

Embodiments of the present disclosure generally relate to imprint compositions and materials and related processes useful for nanoimprint lithography (NIL). In one or more embodiments, an imprint composition is provided and contains a plurality of passivated nanoparticles, one or more solvents, a surface ligand, an additive, and an acrylate. Each passivated nanoparticle contains a core and one or more shells, where the core contains one or more metal oxides and the shell contains one or more passivation materials.

In some embodiments, the passivation material of the shell contains one or more atomic layer deposition (ALD) materials, one or more block copolymers, or one or more silicon-containing compounds. In one or more examples, the silicon-containing compound contains one or more silanes, one or more silanols, one or more siloxanes, one or more silicones, derivatives thereof, or any combination thereof.

In other embodiments, a method of preparing an imprinted surface includes disposing, coating, or otherwise placing an imprint composition containing a plurality of passivated nanoparticles on a substrate, contacting the imprint composition with a stamp having a pattern, converting the imprint composition to a porous nanoimprint film, and removing the stamp from the porous nanoimprint film.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the Figures. It is contemplated that elements and features of one or more embodiments may be beneficially incorporated in other embodiments.

DETAILED DESCRIPTION

Figures 1A, 1B, 1C, 1D, 1E, 1F:
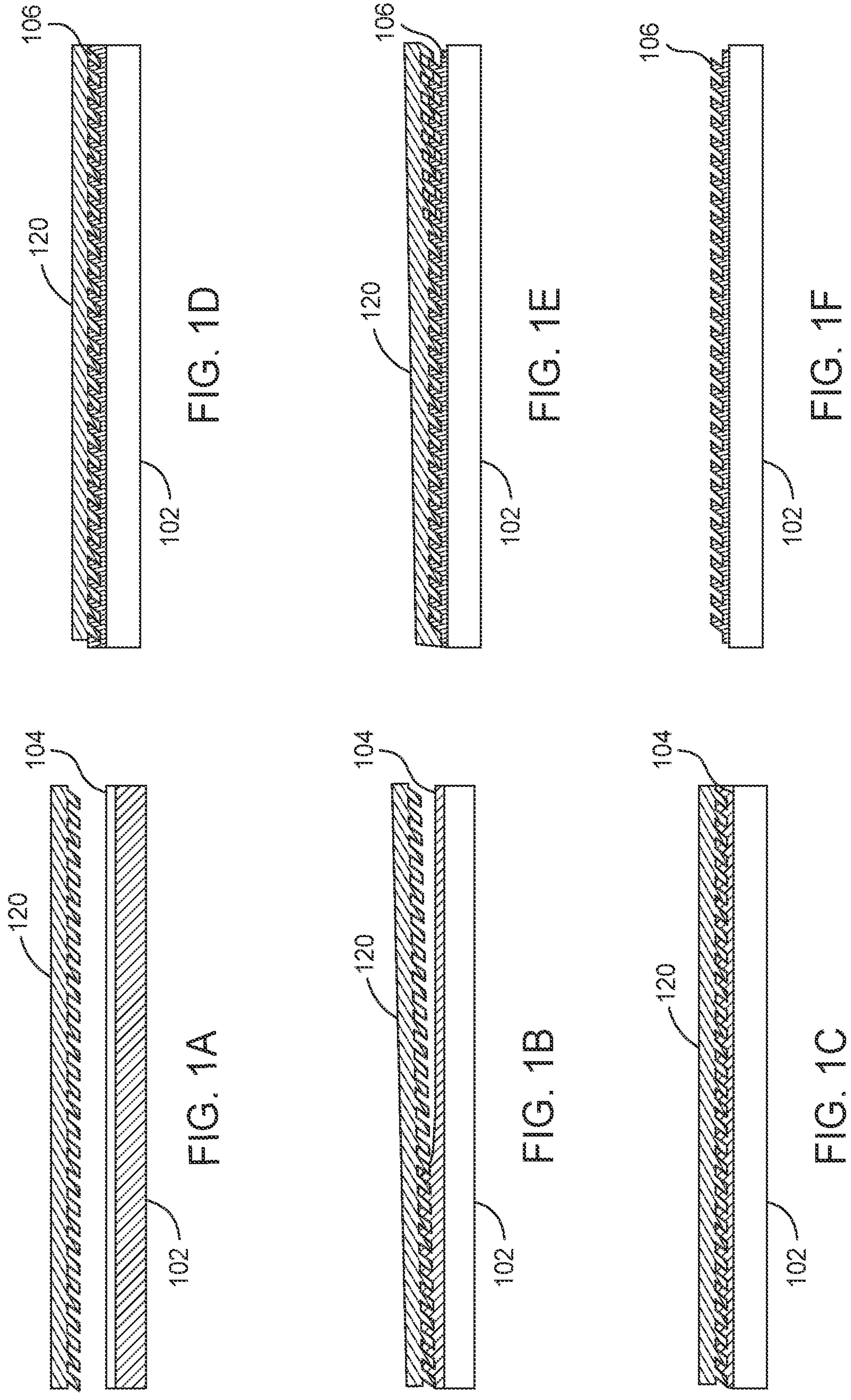
FIGS. 1A-1F depict cross-sectional views of a workpiece being processed through multiple operations while preparing a nanoimprint film containing passivated nanoparticles, according to one or more embodiments described and discussed herein.

Embodiments of the present disclosure generally relate to imprint compositions and imprint materials useful for nanoimprint lithography (NIL). The imprint composition can be converted to the imprint material by applying heat and/or one or more types of radiation, such as light or microwave. In one or more embodiments, the imprint composition contains one or more types of passivated nanoparticles, one or more solvents, one or more surface ligands, one or more additives, and one or more acrylates.

Each passivated nanoparticle (NP) can be a coated particle, such as one, two, or more shells disposed around a core. In some examples, the passivated nanoparticles can contain one or more types of surface ligands coupled to the outer surface of the passivated nanoparticle (e.g., ligated NPs or stabilized NPs). The passivated nanoparticles can have one or more different shapes or geometries, such as spherical, oval, rod, cubical, wire, cylindrical, rectangular, or combinations thereof.

In one or more embodiments, each passivated nanoparticle contains a core and one or more shells encompassing, encapsulating, or otherwise coating the core. The core contains one or more metal oxides and the shell contains one or more passivation materials. Typically, the core and the shell contain different materials. The core contains titanium oxide, niobium oxide, zirconium oxide, hafnium oxide, dopants thereof, or any combination thereof. In some examples, the shell contains one or more metal oxides or other materials different than the core. The passivation material contained in the shell can be or include one or more atomic layer deposition (ALD) materials, a polymeric material containing one or more block copolymers, or a passivation material containing one or more silicon-containing compounds.

The ALD material contained in the shell can be deposited to the core or the outer shell layer by one or more ALD processes. In some examples, the particle to be coated by the passivation material is the core. In other examples, the particle to be coated by the passivation material is the outer-most shell of a nanoparticle which contains one or more shells disposed on a core. The ALD material can be or include silicon oxide, silicon nitride, silicon oxynitride, one or more metal oxides, one or more metal nitrides, one or more metal oxynitrides, dopants thereof, or any combination thereof. Exemplary ALD materials scan be or include silicon oxide, zirconium oxide, hafnium oxide, aluminum oxide, tantalum oxide, niobium oxide, nickel oxide, cobalt oxide, tungsten oxide, vanadium oxide, cerium oxide, tin oxide, indium oxide, hafnium zirconium oxide, hafnium titanium oxide, titanium zirconium oxide, silicon titanium oxide, silicon nitride, titanium nitride, aluminum titanium oxide, one or more dopants thereof, or any combination thereof. In one or more examples, the core contains titanium oxide and the shell contains silicon oxide, zirconium oxide, niobium oxide, or any combination thereof. For example, the core contains titanium oxide, a first shell over the core contains silicon oxide, and a second shell over the first shell contains zirconium oxide. In other examples, the core contains niobium oxide and the shell contains silicon oxide, zirconium oxide, or any combination thereof. In some examples, the core contains zirconium oxide and the shell contains silicon oxide.

In some embodiments, the particles to be coated (e.g., core particles or nanoparticles containing one or more shells) are rotated and/or vibrated in a drum-type chamber while being sequentially exposed to chemical precursors during an ALD process. In other embodiments, the particles to be coated are disposed or otherwise positioned on the substrate while being sequentially exposed to chemical precursors during an ALD process. The ALD process typically includes sequentially exposing the particle to a first precursor and a second precursor to deposit a binary compound. The first precursors can be or include one or more: silicon precursors, zirconium precursors, hafnium precursors, aluminum precursors, tantalum precursors, niobium precursors, nickel precursors, cobalt precursors, tungsten precursors, vanadium precursors, cerium precursors, tin precursors, indium precursors, or combinations thereof. The second precursor can be or include one or more: oxygen precursors (or oxidizing agents), nitrogen precursor (or nitriding agents), or combinations thereof. In other examples, the ALD process includes sequentially exposing the particle to the first precursor, the second precursor, a third precursor, and the second precursor to deposit a ternary or tertiary compound. The third precursor can be any of the precursors listed as the first precursors, which is different than the precursor used as the first precursor.

In some embodiments, the passivation material of the shell is a polymeric material which contains one or more block copolymers. Exemplary block copolymers can be or include polystyrene-block-poly(4-vinylpyridine) (PS-b-P4VP), polystyrene b-polyethylene oxide (PS-b-PEO), polystyrene-b-polybutadiene (PS-b-PB), polystyrene b-polymethylmethacrylate (PS-b-PMMA), polystyrene-block-polybutadiene-block-polystyrene, one or more poloxamers, poly(isoprene-block-dimethylaminoethyl methacrylate) (PI-b-PDMAEMA), poly(ethylene oxide)-poly(propylene oxide)-poly(ethylene oxide) (PEO-PPO-PEO), polymers thereof, derivatives thereof, or any combination thereof.

In one or more examples, the block copolymers can be or include PS-b-P4VP which has molecular weight (MW) of the PS of about 45 kDa to about 320 kDa and a MW of the P4VP of about 27 kDa to about 70 kDa. In some examples, a poloxamer is a triblock copolymer containing a central hydrophobic block of polypropylene glycol flanked by two hydrophilic blocks of polyethylene glycol (PEG), such as Pluronic® F127 poloxamer having a MW of about 12 kDa to about 15 kDa), commercially available from BASF, SE. In other examples, a poloxamer is a poly(ethylene glycol)-block-poly(propylene glycol)-block-poly(ethylene glycol), such as Synperonic® F108 poloxamer having a MW of about 14 kDa to about 16 kDa), commercially available from Croda International, PLC.

The surface passivation can be achieved either during synthesis of the nanoparticle or after the base nanoparticles are prepared. In one or more examples, the nanoparticles are dispersed in one or more solvents (by about 5 wt % to about 50 wt % of NP to solvent) to maintain dispersion qualities. The polymeric material (e.g., block copolymers) is dissolved in the solvent that is miscible and compatible with nanoparticle solvent in about 2 wt % to about 10 wt %. In in-phase modification, the polymeric material can undergo hydrolysis, esterification or hydrogen bonding to attach to the surface of the nanoparticles. The density of passivation is controlled by the concentration of the polymeric material.

In other embodiments, the passivation material of the shell contains one or more silicon-containing compounds. The silicon-containing compound can be or include one or more: silanes, silanols, siloxanes, silicones, other silicon-containing compounds, derivatives thereof, or any combination thereof. Exemplary silicon-containing compounds can be or include (3-acetamidopropyl)trimethoxysilane, octeyltriethoxy silane, octeyltrimethoxy silane, 3-(trimethoxysilyl)propyl methacrylate, propyltriethoxy silane, (3-acryloxypropyl)tris(trimethylsiloxy)silane, dimethyldiethoxysilane, polydimethylsiloxane, γ-glycidoxypropyltrimethoxy-silane (GPMS), polydiphenylsiloxane, hexamethylcyclotrisiloxane, aminopropyltriethoxysilane, complexes thereof, derivatives thereof, or any combination thereof.

The overall passivated nanoparticle can have a size or a diameter of about 2 nm, about 5 nm, about 8 nm, about 10 nm, about 12 nm, about 15 nm, about 20 nm, about 25 nm, about 30 nm, or about 35 nm to about 40 nm, about 50 nm, about 60 nm, about 80 nm, about 100 nm, about 150 nm, or about 200 nm. For example, the overall passivated nanoparticle can have a size or a diameter of about 2 nm to about 200 nm, about 2 nm to about 150 nm, about 2 nm to about 100 nm, about 2 nm to about 80 nm, about 2 nm to about 60 nm, about 2 nm to about 50 nm, about 2 nm to about 40 nm, about 2 nm to about 30 nm, about 2 nm to about 20 nm, about 2 nm to about 15 nm, about 2 nm to about 10 nm, about 10 nm to about 200 nm, about 10 nm to about 150 nm, about 10 nm to about 100 nm, about 10 nm to about 80 nm, about 10 nm to about 60 nm, about 10 nm to about 50 nm, about 10 nm to about 40 nm, about 10 nm to about 30 nm, about 10 nm to about 20 nm, about 10 nm to about 15 nm, about 50 nm to about 200 nm, about 50 nm to about 150 nm, about 50 nm to about 100 nm, about 50 nm to about 80 nm, or about 50 nm to about 60 nm.

The core of the passivated nanoparticle has a diameter of less than 100 nm, such as less than 80 nm, or less than 50 nm, such as about 2 nm, about 3 nm, about 5 nm, about 8 nm, about 10 nm, or about 12 nm to about 15 nm, about 18 nm, about 20 nm, about 25 nm, about 30 nm, about 35 nm, about 40 nm, about 45 nm, or about 50 nm. For example, the core has a diameter of about 2 nm to about 50 nm, about 2 nm to about 45 nm, about 2 nm to about 40 nm, about 2 nm to about 35 nm, about 2 nm to about 30 nm, about 2 nm to about 28 nm, about 2 nm to about 25 nm, about 2 nm to about 22 nm, about 2 nm to about 20 nm, about 2 nm to about 18 nm, about 2 nm to about 15 nm, about 2 nm to about 12 nm, about 2 nm to about 10 nm, about 2 nm to about 8 nm, about 2 nm to about 5 nm, about 5 nm to about 50 nm, about 5 nm to about 45 nm, about 5 nm to about 40 nm, about 5 nm to about 35 nm, about 5 nm to about 30 nm, about 5 nm to about 28 nm, about 5 nm to about 25 nm, about 5 nm to about 22 nm, about 5 nm to about 20 nm, about 5 nm to about 18 nm, about 5 nm to about 15 nm, about 5 nm to about 12 nm, about 5 nm to about 10 nm, about 5 nm to about 8 nm, about 10 nm to about 50 nm, about 10 nm to about 45 nm, about 10 nm to about 40 nm, about 10 nm to about 35 nm, about 10 nm to about 30 nm, about 10 nm to about 28 nm, about 10 nm to about 25 nm, about 10 nm to about 22 nm, about 10 nm to about 20 nm, about 10 nm to about 18 nm, about 10 nm to about 15 nm, or about 10 nm to about 12 nm.

The shell of the passivated nanoparticle has a thickness of about 0.1 nm, about 0.2 nm, about 0.5 nm, about 0.8 nm, about 1 nm, about 1.5 nm, about 2 nm, about 3 nm, about 5 nm, about 8 nm, or about 10 nm to about 12 nm, about 15 nm, about 18 nm, about 20 nm, about 25 nm, about 30 nm, about 35 nm, about 40 nm, or about 50 nm. For example, the shell has a thickness of about 0.1 nm to about 50 nm, about 0.1 nm to about 40 nm, about 0.1 nm to about 30 nm, about 0.1 nm to about 25 nm, about 0.1 nm to about 20 nm, about 0.1 nm to about 18 nm, about 0.1 nm to about 15 nm, about 0.1 nm to about 12 nm, about 0.1 nm to about 10 nm, about 0.1 nm to about 8 nm, about 0.1 nm to about 5 nm, about 0.1 nm to about 3 nm, about 0.1 nm to about 2 nm, about 0.1 nm to about 1 nm, about 0.5 nm to about 40 nm, about 0.5 nm to about 30 nm, about 0.5 nm to about 25 nm, about 0.5 nm to about 20 nm, about 0.5 nm to about 15 nm, about 0.5 nm to about 10 nm, about 0.5 nm to about 8 nm, about 0.5 nm to about 5 nm, about 0.5 nm to about 3 nm, about 0.5 nm to about 2 nm, about 0.5 nm to about 1 nm, about 1 nm to about 40 nm, about 1 nm to about 30 nm, about 1 nm to about 25 nm, about 1 nm to about 20 nm, about 1 nm to about 18 nm, about 1 nm to about 15 nm, about 1 nm to about 12 nm, about 1 nm to about 10 nm, about 1 nm to about 8 nm, about 1 nm to about 5 nm, about 1 nm to about 3 nm, about 5 nm to about 50 nm, about 5 nm to about 40 nm, about 5 nm to about 30 nm, about 5 nm to about 25 nm, about 5 nm to about 20 nm, about 5 nm to about 18 nm, about 5 nm to about 15 nm, about 5 nm to about 12 nm, about 5 nm to about 10 nm, or about 5 nm to about 8 nm.

In some examples, the core has a diameter of about 2 nm to about 50 nm and the shell has a thickness of about 0.1 nm to about 40 nm. In other examples, the core has a diameter of about 5 nm to about 40 nm and the shell has a thickness of about 0.5 nm to about 30 nm. In some examples, the core has a diameter of about 10 nm to about 30 nm and the shell has a thickness of about 1 nm to about 20 nm.

In one or more embodiments, the imprint composition contains the passivated nanoparticles at a concentration of about 0.1 weight percent (wt %), about 0.5 wt %, about 1 wt %, about 2 wt %, about 3 wt %, about 5 wt %, about 6 wt %, about 8 wt %, or about 10 wt % to about 12 wt %, about 15 wt %, about 18 wt %, about 20 wt %, about 22 wt %, about 24 wt %, about 25 wt %, about 28 wt %, about 30 wt %, about 32 wt %, about 35 wt %, about 38 wt %, or about 40 wt %. For example, the imprint composition contains the passivated nanoparticles at a concentration of about 0.1 wt % to about 40 wt %, about 0.5 wt % to about 40 wt %, about 0.5 wt % to about 35 wt %, about 0.5 wt % to about 32 wt %, about 0.5 wt % to about 30 wt %, about 0.5 wt % to about 28 wt %, about 0.5 wt % to about 25 wt %, about 0.5 wt % to about 22 wt %, about 0.5 wt % to about 20 wt %, about 0.5 wt % to about 18 wt %, about 0.5 wt % to about 15 wt %, about 0.5 wt % to about 12 wt %, about 0.5 wt % to about 10 wt %, about 0.5 wt % to about 8 wt %, about 0.5 wt % to about 6 wt %, about 0.5 wt % to about 5 wt %, about 0.5 wt % to about 4 wt %, about 0.5 wt % to about 3 wt %, about 0.5 wt % to about 2 wt %, about 0.5 wt % to about 1.5 wt %, about 0.5 wt % to about 1 wt %, about 2 wt % to about 40 wt %, about 2 wt % to about 35 wt %, about 2 wt % to about 32 wt %, about 2 wt % to about 30 wt %, about 2 wt % to about 28 wt %, about 2 wt % to about 25 wt %, about 2 wt % to about 22 wt %, about 2 wt % to about 20 wt %, about 2 wt % to about 18 wt %, about 2 wt % to about 15 wt %, about 2 wt % to about 12 wt %, about 2 wt % to about 10 wt %, about 2 wt % to about 8 wt %, about 2 wt % to about 6 wt %, about 2 wt % to about 5 wt %, about 2 wt % to about 4 wt %, about 2 wt % to about 3 wt %, about 5 wt % to about 40 wt %, about 5 wt % to about 35 wt %, about 5 wt % to about 32 wt %, about 5 wt % to about 30 wt %, about 5 wt % to about 28 wt %, about 5 wt % to about 25 wt %, about 5 wt % to about 22 wt %, about 5 wt % to about 20 wt %, about 5 wt % to about 18 wt %, about 5 wt % to about 15 wt %, about 5 wt % to about 12 wt %, about 5 wt % to about 10 wt %, about 5 wt % to about 8 wt %, or about 5 wt % to about 6 wt %.

In other embodiments, the imprint composition contains the passivated nanoparticles at a concentration of about 40 wt %, about 50 wt %, about 55 wt %, about 60 wt %, about 62 wt %, or about 65 wt % to about 68 wt %, about 70 wt %, about 75 wt %, about 80 wt %, about 85 wt %, about 88 wt %, about 90 wt %, about 92 wt %, about 93 wt %, about 94 wt %, about 95 wt %, about 96 wt %, about 97 wt %, about 98 wt %, or more. For example, the imprint composition contains the passivated nanoparticles at a concentration of about 40 wt % to about 98 wt %, about 50 wt % to about 95 wt %, about 50 wt % to about 90 wt %, about 50 wt % to about 80 wt %, about 50 wt % to about 75 wt %, about 50 wt % to about 70 wt %, about 50 wt % to about 65 wt %, about 50 wt % to about 60 wt %, about 50 wt % to about 55 wt %, about 60 wt % to about 95 wt %, about 60 wt % to about 90 wt %, about 60 wt % to about 80 wt %, about 60 wt % to about 75 wt %, about 60 wt % to about 70 wt %, about 60 wt % to about 65 wt %, about 70 wt % to about 95 wt %, about 70 wt % to about 90 wt %, about 70 wt % to about 80 wt %, or about 70 wt % to about 75 wt %.

The surface ligand can be or include one or more carboxylic acids, one or more esters, one or more amines, one or more alcohols, one or more silanes, salts thereof, complexes thereof, or any combination thereof. Exemplary surface ligands can be or include oleic acid, stearic acid, propionic acid, benzoic acid, palmitic acid, myristic acid, methylamine, oleylamine, butylamine, benzyl alcohol, oleyl alcohol, butanol, octanol, dodecanol, octyltrimethoxy silane, octyltriethoxy silane, octenyltrimethoxy silane, octenyltriethoxy silane, 3-(trimethoxysilyl)propyl methacrylate, propyltriethoxy silane, salts thereof, esters thereof, complexes thereof, or any combination thereof. In some examples, the surface ligand is at a concentration of about 8 wt % to about 50 wt %, based on the weight of the passivated nanoparticles.

The imprint composition contains the surface ligand at a concentration of about 0.5 wt %, about 1 wt %, about 2 wt %, about 3 wt %, about 5 wt %, about 7 wt %, about 8 wt %, or about 10 wt % to about 12 wt %, about 15 wt %, about 18 wt %, about 20 wt %, about 25 wt %, about 30 wt %, about 35 wt %, about 40 wt %, about 45 wt %, or about 50 wt %. For example, the imprint composition contains the surface ligand at a concentration of about 0.5 wt % to about 50 wt %, about 1 wt % to about 50 wt %, about 3 wt % to about 50 wt %, about 5 wt % to about 50 wt %, about 5 wt % to about 40 wt %, about 5 wt % to about 35 wt %, about 5 wt % to about 30 wt %, about 5 wt % to about 25 wt %, about 5 wt % to about 20 wt %, about 5 wt % to about 15 wt %, about 5 wt % to about 10 wt %, about 10 wt % to about 50 wt %, about 10 wt % to about 40 wt %, about 10 wt % to about 35 wt %, about 10 wt % to about 30 wt %, about 10 wt % to about 25 wt %, about 10 wt % to about 20 wt %, about 10 wt % to about 15 wt %, about 15 wt % to about 50 wt %, about 15 wt % to about 40 wt %, about 15 wt % to about 35 wt %, about 15 wt % to about 30 wt %, about 15 wt % to about 25 wt %, or about 15 wt % to about 20 wt %.

The solvent can be or include one or more nanoparticle dispersion solvents, one or more imprinting solvents, other types of solvents, or any combination thereof. The nanoparticle dispersion solvent can be or include one or more glycol ethers, alcohols, acetates, esters thereof, salts thereof, derivatives thereof, or any combination thereof. In some examples, the nanoparticle dispersion solvent can be or include one or more p-series glycol ethers, one or more e-series glycol ethers, or any combination thereof. In one or more examples, the nanoparticle dispersion solvent contains propylene glycol methyl ether acetate (PGMEA). The imprinting solvent can be or include one or more alcohols, one or more esters, salts thereof, or any combination thereof. In one or more examples, the imprinting solvent contains ethyl lactate.

In one or more embodiments, the imprint composition contains one or more solvents at a concentration of about 50 wt %, about 55 wt %, about 60 wt %, about 62 wt %, about 65 wt %, about 68 wt %, about 70 wt %, about 72 wt %, about 75 wt %, or about 80 wt % to about 83 wt %, about 85 wt %, about 87 wt %, about 88 wt %, about 90 wt %, about 92 wt %, about 94 wt %, about 95 wt %, about 97 wt %, or about 98 wt %. For example, the imprint composition contains one or more solvents at a concentration of about 50 wt % to about 98 wt %, about 60 wt % to about 98 wt %, about 60 wt % to about 95 wt %, about 60 wt % to about 90 wt %, about 60 wt % to about 88 wt %, about 60 wt % to about 85 wt %, about 60 wt % to about 83 wt %, about 60 wt % to about 80 wt %, about 60 wt % to about 78 wt %, about 60 wt % to about 75 wt %, about 60 wt % to about 72 wt %, about 60 wt % to about 70 wt %, about 60 wt % to about 68 wt %, about 60 wt % to about 65 wt %, about 60 wt % to about 63 wt %, about 70 wt % to about 98 wt %, about 70 wt % to about 95 wt %, about 70 wt % to about 90 wt %, about 70 wt % to about 88 wt %, about 70 wt % to about 85 wt %, about 70 wt % to about 83 wt %, about 70 wt % to about 80 wt %, about 70 wt % to about 78 wt %, about 70 wt % to about 75 wt %, about 70 wt % to about 72 wt %, about 80 wt % to about 98 wt %, about 80 wt % to about 95 wt %, about 80 wt % to about 90 wt %, about 80 wt % to about 88 wt %, about 80 wt % to about 85 wt %, about 80 wt % to about 83 wt %, or about 80 wt % to about 82 wt %.

In some embodiments, the imprint composition contains the nanoparticle dispersion solvent at a concentration of about 0.5 wt %, about 0.8 wt %, about 1 wt %, about 1.5 wt %, about 2 wt %, about 2.5 wt %, about 3 wt %, about 3.5 wt %, about 4 wt %, about 5 wt %, or about 6 wt % to about 7 wt %, about 8 wt %, about 10 wt %, about 12 wt %, about 14 wt %, about 15 wt %, about 18 wt %, about 20 wt %, or about 25 wt %. For example, the imprint composition contains the nanoparticle dispersion solvent at a concentration of about 0.5 wt % to about 20 wt %, about 1 wt % to about 20 wt %, about 1 wt % to about 18 wt %, about 1 wt % to about 15 wt %, about 1 wt % to about 13 wt %, about 1 wt % to about 12 wt %, about 1 wt % to about 11 wt %, about 1 wt % to about 10 wt %, about 1 wt % to about 8 wt %, about 1 wt % to about 7 wt %, about 1 wt % to about 6 wt %, about 1 wt % to about 5 wt %, about 1 wt % to about 4 wt %, about 1 wt % to about 3 wt %, about 5 wt % to about 20 wt %, about 5 wt % to about 18 wt %, about 5 wt % to about 15 wt %, about 5 wt % to about 13 wt %, about 5 wt % to about 12 wt %, about 5 wt % to about 11 wt %, about 5 wt % to about 10 wt %, about 5 wt % to about 8 wt %, about 5 wt % to about 7 wt %, about 5 wt % to about 6 wt %, about 8 wt % to about 20 wt %, about 8 wt % to about 18 wt %, about 8 wt % to about 15 wt %, about 8 wt % to about 13 wt %, about 8 wt % to about 12 wt %, about 8 wt % to about 11 wt %, about 8 wt % to about 10 wt %, or about 8 wt % to about 9 wt %.

In other embodiments, the imprint composition contains the imprinting solvent at a concentration of about 50 wt %, about 55 wt %, about 60 wt %, about 62 wt %, about 65 wt %, about 68 wt %, or about 70 wt % to about 72 wt %, about 75 wt %, about 78 wt %, about 80 wt %, about 82 wt %, about 83 wt %, about 85 wt %, about 87 wt %, about 88 wt %, about 90 wt %, or about 95 wt %. For example, the imprint composition contains the imprinting solvent at a concentration of about 50 wt % to about 95 wt %, about 60 wt % to about 95 wt %, about 60 wt % to about 90 wt %, about 60 wt % to about 88 wt %, about 60 wt % to about 85 wt %, about 60 wt % to about 83 wt %, about 60 wt % to about 80 wt %, about 60 wt % to about 78 wt %, about 60 wt % to about 75 wt %, about 60 wt % to about 72 wt %, about 60 wt % to about 70 wt %, about 60 wt % to about 68 wt %, about 60 wt % to about 65 wt %, about 60 wt % to about 63 wt %, about 70 wt % to about 98 wt %, about 70 wt % to about 95 wt %, about 70 wt % to about 90 wt %, about 70 wt % to about 88 wt %, about 70 wt % to about 85 wt %, about 70 wt % to about 83 wt %, about 70 wt % to about 80 wt %, about 70 wt % to about 78 wt %, about 70 wt % to about 75 wt %, about 70 wt % to about 72 wt %, about 75 wt % to about 98 wt %, about 75 wt % to about 95 wt %, about 75 wt % to about 90 wt %, about 75 wt % to about 88 wt %, about 75 wt % to about 85 wt %, about 75 wt % to about 83 wt %, about 75 wt % to about 80 wt %, or about 75 wt % to about 78 wt %.

The additive can be or include one or more perfluoroalkyl ethers, one or more polyglycols, one or more fatty acids, one or more silanes, one or more siloxanes, or any combination thereof. Exemplary additives can be or include fluorosurfactant, fluoro-additive, and/or fluorocarbon (e.g., CAPSTONE® FS-66 or FS-68 fluorosurfactant, available from DuPont), glycolic acid ethoxylate oleyl ether, polyethylene glycol, polypropylene glycol, lauric acid, myristic acid, stearic acid, palmitic acid, dimethyldiethoxysilane, polydimethylsiloxane, polydiphenylsiloxane, hexamethylcyclotrisiloxane, octamethylcyclotetrasiloxane, silanol terminated polydimethylsiloxane, vinyl terminated polydimethylsiloxane, 1,2-propanediol, salts thereof, esters thereof, complexes thereof, or any combination thereof. The additive can be or include one or more diols, one or more alcohols with three or more alcohol groups, or any combination thereof. In one or more examples, the additive contains 1,2-propanediol. In some examples, the additive is at a concentration of about 0.01 wt % to about 2.5 wt %, based on the weight of the passivated nanoparticles.

The imprint composition contains the additive at a concentration of about 0.01 wt %, about 0.05 wt %, about 0.1 wt %, about 0.2 wt %, about 0.3 wt %, about 0.5 wt %, about 0.8 wt %, or about 1 wt % to about 1.2 wt %, about 1.5 wt %, about 1.8 wt %, about 2 wt %, about 2.5 wt %, about 3 wt %, about 3.5 wt %, about 4 wt %, about 5 wt %, about 6 wt %, about 8 wt %, or about 10 wt %. For example, the imprint composition contains the additive at a concentration of about 0.01 wt % to about 10 wt %, about 0.01 wt % to about 8 wt %, about 0.01 wt % to about 5 wt %, about 0.01 wt % to about 4 wt %, about 0.01 wt % to about 3 wt %, about 0.01 wt % to about 2 wt %, about 0.01 wt % to about 1 wt %, about 0.01 wt % to about 0.5 wt %, about 0.01 wt % to about 0.1 wt %, about 0.01 wt % to about 0.05 wt %, about 0.1 wt % to about 10 wt %, about 0.1 wt % to about 8 wt %, about 0.1 wt % to about 5 wt %, about 0.1 wt % to about 4 wt %, about 0.1 wt % to about 3 wt %, about 0.1 wt % to about 2 wt %, about 0.1 wt % to about 1 wt %, about 0.1 wt % to about 0.5 wt %, about 1 wt % to about 10 wt %, about 1 wt % to about 8 wt %, about 1 wt % to about 5 wt %, about 1 wt % to about 4 wt %, about 1 wt % to about 3 wt %, about 1 wt % to about 2 wt %, or about 1 wt % to about 1.5 wt %.

The acrylate can be or include one or more methacrylates, one or more ethylacrylates, one or more propylacrylates, one or more butylacrylates, one or more mono-functional acrylates, one or more di-functional acrylates, one or more tri-functional acrylates, other multi-functional acrylates, or any combination thereof. Exemplary acrylates can be or include 3-(trimethoxysilyl)propyl methacrylate (3-MPS), 3-(trimethoxysilyl)propyl acrylate, di(ethylene glycol) methyl ether methacrylate, ethylene glycol methyl ether methacrylate, 2-ethylhexyl methacrylate, ethyl methacrylate, hexyl methacrylate, methacrylic acid, vinyl methacrylate, monomers thereof, polymers thereof, salts thereof, complexes thereof, or any combination. In some examples, the acrylate is at a concentration of about 0.05 wt % to about 10 wt %, based on the weight of the passivated nanoparticles.

The imprint composition contains the acrylate at a concentration of about 0.1 wt %, about 0.2 wt %, about 0.3 wt %, about 0.5 wt %, about 0.8 wt %, about 1 wt % to about 1.2 wt %, about 1.5 wt %, about 1.8 wt %, or about 2 wt %, about 2.2 wt %, about 2.3 wt %, about 2.5 wt %, about 2.8 wt %, about 3 wt %, about 3.2 wt %, about 3.5 wt %, about 3.8 wt %, about 4 wt %, about 5 wt %, about 6 wt %, about 8 wt %, about 10 wt %, about 12 wt %, about 15 wt %, about 18 wt %, or about 20 wt %. For example, the imprint composition contains the acrylate at a concentration of about 0.1 wt % to about 20 wt %, about 0.1 wt % to about 15 wt %, about 0.1 wt % to about 10 wt %, about 0.1 wt % to about 8 wt %, about 0.1 wt % to about 5 wt %, about 0.1 wt % to about 4 wt %, about 0.1 wt % to about 3 wt %, about 0.1 wt % to about 2 wt %, about 0.1 wt % to about 1 wt %, about 0.1 wt % to about 0.5 wt %, about 1 wt % to about 20 wt %, about 1 wt % to about 15 wt %, about 1 wt % to about 10 wt %, about 1 wt % to about 8 wt %, about 1 wt % to about 5 wt %, about 1 wt % to about 4 wt %, about 1 wt % to about 3.5 wt %, about 1 wt % to about 3.2 wt %, about 1 wt % to about 3 wt %, about 1 wt % to about 2.8 wt %, about 1 wt % to about 2.5 wt %, about 1 wt % to about 2.3 wt %, about 1 wt % to about 2.2 wt %, about 1 wt % to about 2 wt %, about 1 wt % to about 1.8 wt %, about 1 wt % to about 1.5 wt %, about 1.8 wt % to about 20 wt %, about 1.8 wt % to about 15 wt %, about 1.8 wt % to about 10 wt %, about 1.8 wt % to about 8 wt %, about 1.8 wt % to about 5 wt %, about 1.8 wt % to about 4 wt %, about 1.8 wt % to about 3.5 wt %, about 1.8 wt % to about 3.2 wt %, about 1.8 wt % to about 3 wt %, about 1.8 wt % to about 2.8 wt %, about 1.8 wt % to about 2.5 wt %, about 1.8 wt % to about 2.3 wt %, about 1.8 wt % to about 2.2 wt %, or about 1.8 wt % to about 2 wt %.

In one or more examples, the imprint composition contains about 0.5 wt % to about 40 wt % of the passivated nanoparticles, about 50 wt % to about 90 wt % of one or more solvents, about 5 wt % to about 40 wt % of the surface ligand, about 0.01 wt % to about 5 wt % of the additive, and about 0.1 wt % to about 10 wt % of the acrylate. In other examples, the imprint composition contains about 1 wt % to about 25 wt % of the passivated nanoparticles, about 60 wt % to about 85 wt % of one or more solvents, about 6 wt % to about 35 wt % of the surface ligand, about 0.05 wt % to about 3 wt % of the additive, and about 0.3 wt % to about 8 wt % of the acrylate. In some examples, the imprint composition contains about 5 wt % to about 20 wt % of the passivated nanoparticles, about 65 wt % to about 80 wt % of one or more solvents, about 7 wt % to about 31 wt % of the surface ligand, about 0.09 wt % to about 1.5 wt % of the additive, and about 0.5 wt % to about 6 wt % of the acrylate.

The imprint composition can have a viscosity of about 1 cP, about 2 cP, about 3 cP, about 5 cP, about 8 cP, or about 10 cP to about 12 cP, about 15 cP, about 20 cP, about 25 cP, about 30 cP, about 40 cP, about 50 cP, or about 70 cP, as measured at a temperature of 23° C. For example, the imprint composition can have a viscosity of about 1 cP to about 70 cP, about 1 cP to about 50 cP, about 1 cP to about 40 cP, about 1 cP to about 30 cP, about 1 cP to about 20 cP, about 1 cP to about 10 cP, about 1 cP to about 5 cP, about 10 cP to about 70 cP, about 10 cP to about 50 cP, about 10 cP to about 40 cP, about 10 cP to about 30 cP, about 10 cP to about 20 cP, about 20 cP to about 70 cP, about 20 cP to about 50 cP, about 20 cP to about 40 cP, about 20 cP to about 30 cP, or about 20 cP to about 25 cP, as measured at a temperature of 23° C.

Methods for Preparing an Imprinted Surface

In one or more embodiments, methods for preparing an imprinted surface, such as an NIL film, are provided. The imprinted surface is one or more exposed surfaces of the nanoimprint film described and discussed herein. The method includes disposing, coating, or otherwise placing an imprint composition on one or more substrates, contacting the imprint composition with a stamp having a pattern, converting the imprint composition to an imprint material (e.g., a nanoimprint film), and removing the stamp from the imprint material. In some examples, the substrate (e.g., wafer) can be or include glass, quartz, silicon oxide, such as a glass substrate or a glass wafer. In other examples, the substrate can be or include silicon, silicon-germanium, plastic, and/or other materials. The imprint composition can have a refractive index of about 1.7 to about 2.0. The pattern on the stamp and transferred to the imprinted surface can be a 1-dimension pattern, a 2-dimension pattern, or a 3-dimension pattern.

FIGS. 1A-1F depict cross-sectional views of a workpiece being processed through multiple operations while preparing a nanoimprint film containing passivated nanoparticles, such as the nanoimprint films according to one or more embodiments described and discussed herein. The nanoimprint film is formed on the substrate by an imprint process. The imprint process includes disposing an imprint composition 104 containing passivated nanoparticles on a substrate 102 and aligning a stamp 120 above or adjacent to the imprint composition 104 (FIG. 1A). The imprint composition 104 is impressed or otherwise contacted with the stamp 120 having a pattern (FIGS. 1B-1C). The imprint composition 104 is converted to a nanoimprint film 106 (FIG. 1D). In some examples, a curing process with heat and/or radiation (UV light) is used to convert the imprint composition 104 to the nanoimprint film 106. The stamp 120 is removed from the nanoimprint film 106, which is left disposed on the substrate 102 (FIGS. 1E-1F).

In some examples, the imprint composition is disposed on the substrate by spin coating, drop casting, blade coating, and/or other coating processes. The imprint composition is disposed on the substrate as a film or a layer having a predetermined thickness. The thickness of the imprint composition is about 50 nm, about 80 nm, about 100 nm, about 120 nm, about 150 nm, or about 200 nm to about 250 nm, about 300 nm, about 400 nm, about 500 nm, about 600 nm, about 800 nm, about 1,000 nm, about 1,200 nm, or thicker. For example, the thickness of the imprint composition is about 50 nm to about 1,000 nm, about 100 nm to about 1,000 nm, about 200 nm to about 1,000 nm, about 400 nm to about 1,000 nm, about 500 nm to about 1,000 nm, about 600 nm to about 1,000 nm, about 800 nm to about 1,000 nm, about 50 nm to about 600 nm, about 100 nm to about 600 nm, about 200 nm to about 600 nm, about 400 nm to about 600 nm, about 500 nm to about 600 nm, about 50 nm to about 400 nm, about 100 nm to about 400 nm, about 200 nm to about 400 nm, or about 300 nm to about 400 nm.

The imprint composition is converted to the imprint material by exposing the imprint composition to heat, ultraviolet light, infrared light, visible light, microwave radiation, and/or any combination thereof. In one or more examples, when converting the imprint composition to the imprint material, the imprint composition is exposed to a light source having a wavelength of about 300 nm to about 365 nm. In other examples, when converting the imprint composition to the imprint material, the imprint composition is exposed to heat and maintained at a temperature of about 30° C. to about 100° C. for a time period of about 30 seconds to about 1 hour. In some examples, the imprint composition is exposed to heat and maintained at a temperature of about 50° C. to about 60° C. for a time period of about 1 minute to about 15 minutes.

In one or more embodiments, the one or more acrylates in the imprint composition can be polymerized and/or oligomerized while producing (e.g., curing or otherwise converting) the imprint material.

In one or more embodiments described and discussed herein, the imprint material contains or includes inorganic oxide nanoparticles (about 1 wt % to about 95 wt %), methacrylate or acrylate or chloro-acrylate binder (about 0.1 wt % to about 10 wt %), high boiling point components such as diols, fatty acids, amines (about 0.1 wt % to about 5 wt %), and an ether or acetate solvent (about 5 wt % to about 20 wt %) with optimal viscosity (about 1 cP to about 50 cP at about 23° C.). The imprint material exhibits high refractive index of greater than 1.7 with optical transparency of greater than 90% in the visible region at different weight percentages (about 1 wt % to about 50 wt %) and allows high resolution large area patterning with a feature shrinkage of about 1% to about 30% (in some examples, less than 1%). Nanoimprint lithography combined with high refractive index materials provides a unique route to fabricate printable devices by directly imprinting this functional material. The patterned films have the final desired optical functionality, and there is no need for additional etching steps. This approach combines the advantages of both the top-down lithography process to fabricate micro/nanostructures with high control, and of the bottom-up synthetic chemistry approach to design and tune the properties of the patterned films.

In other embodiments described and discussed herein, a passivated nanoparticle imprint composition was prepared and has low viscosity of about 1 cP to about 50 cP (at about 23° C.), a high refractive index, and is optically transparent and easy processable. The imprint composition can include or contain the passivated nanoparticles, as described and discussed herein, disposed in a high boiling point ether or acetate-based solvent at about 1 wt % to about 80 wt %. The imprint composition can include or contain one or more of: a methacrylate or acrylate binder (about 0.1 wt % to about 10 wt %), fatty acid (about 0.05 wt % to about 5 wt %), an amine (about 0.05 wt % to about 5 wt %), a PEG based monomer (about 0.1 wt % to about 15 wt %), and a perfluoro- or siloxane dispersant (about 0.05 wt % to about 5 wt %), which acts as a surfactant. The final imprint composition remains optically transparent at room temperature (about 23° C.) for more than 6 months and can be used with or without filtration.

In some embodiments, a scalable, solvent-assisted soft NIL method is used to generate large areas of nanopatterned features and structures. This form of NIL uses polydimethylsiloxane (PDMS) or other silicone stamps, many of which can be produced from one silicon master, and each of which can be reused many times, minimizing costs. The area of imprinted structures is thus primarily limited by only the size of the original patterned master. Feature sizes of less than 100 nm can be replicated using PDMS. Briefly, the imprint composition is dispensed on the surface of a substrate either filtered or as such. The substrate is spun to produce a film with a thickness of about 100 nm to about 400 nm. The PDMS mold is placed on the surface of the spun-on film and then cured thermally at about 50° C. to about 60° C. The UV curing is done with a light source at a wavelength of about 300 nm to about 365 nm and with a power of about 10 $Jcm^{-2}$ to about 50 $Jcm^{-2}$. After curing of the imprint composition to produce an imprint material, the PDMS stamp is removed in or opposite to the direction of the grating. The released stamp is used again, and the imprint can be additionally cured by thermal and/or UV processes to densify the material.

Figure 2:
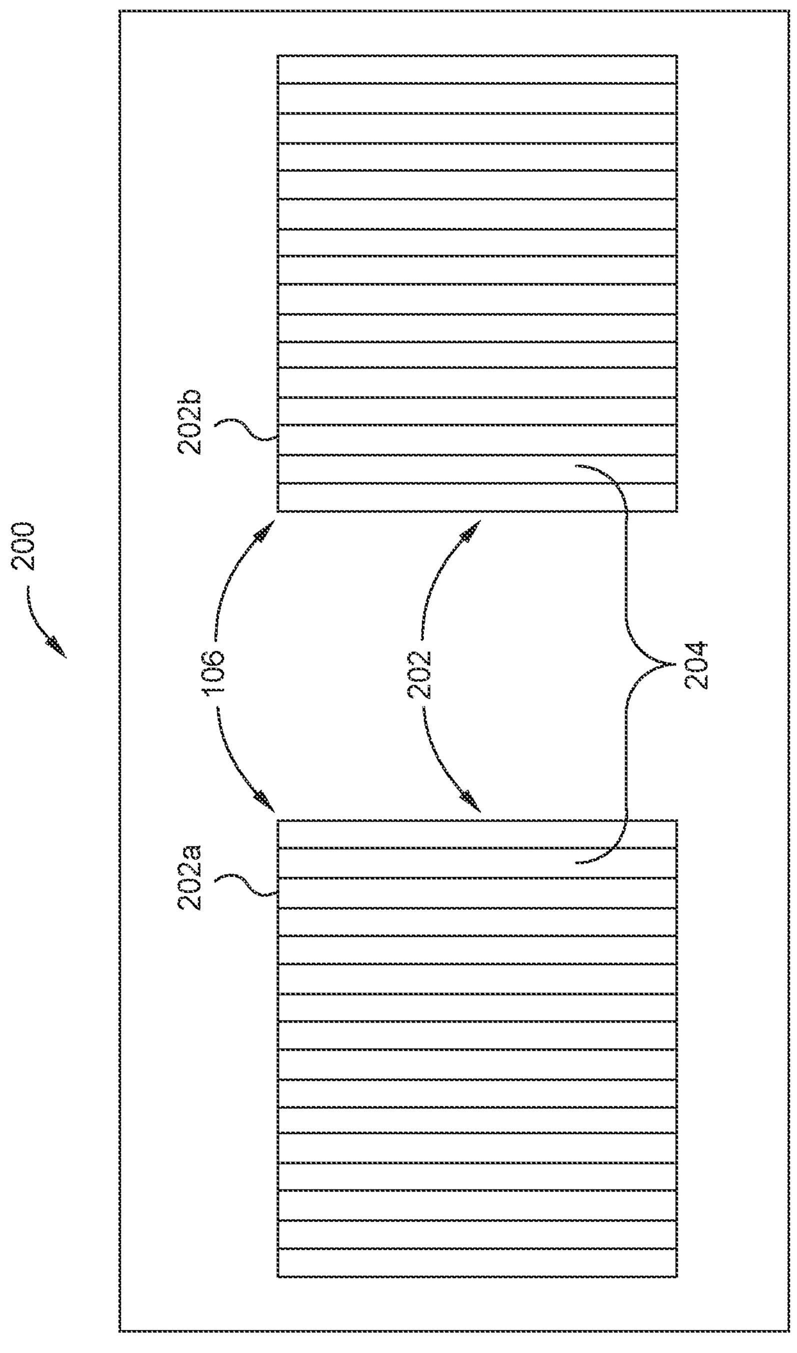
FIG. 2 depicts a front view of an optical device, according to one or more embodiments described and discussed herein.

FIG. 2 depicts a front view of an optical device 200 containing the nanoimprint film 106, as depicted in FIG. 1F, according to one or more embodiments described and discussed herein. It is to be understood that the optical device 200 described below is an exemplary optical device. In one or more embodiments, the optical device 200 is a waveguide combiner, such as an augmented reality waveguide combiner. In other embodiments, the optical device 200 is a flat optical device, such as a metasurface. The optical device 200 includes a plurality of device structures 204. The device structures 204 may be nanostructures having sub-micro dimensions, e.g., nano-sized dimensions, such as critical dimensions less than 1 μm. In one or more embodiments, regions of the device structures 204 correspond to one or more gratings 202, such as the grating areas 202*a* and 202*b*. In one or more embodiments, the optical device 200 includes a first grating area 202*a* and a second grating area 202*b* and each of the first grating area 202*a* and 202*b* each contain a plurality of device structures 204.

The depth of the gratings 202 may vary across the grating areas 202*a* and 202*b* in embodiments described herein. In some embodiments, the depth of the gratings 202 may vary smoothly over the first grating area 202*a* and over the second grating area 202*b*. In one or more examples, the depth may range from about 10 nm to about 400 nm across one of the grating areas. The grating area 202*a*, in some examples, can range from about 20 mm to about 50 mm on a given side. Therefore, as some examples, the angle of the change in the depth of the gratings 202 may be on the order of 0.0005 degrees.

In embodiments described herein, the device structures 204 may be created using laser ablation. Laser ablation, as used herein, is used to produce three-dimensional microstructures in the device material, or optionally to create a variable-depth structure in a sacrificial layer overlaying the device material as part of a variable-depth structure process. Using laser ablation to create the optical structures 204 allows for fewer processing operations and higher variable-depth resolution than existing methods.

Embodiments of the present disclosure further relate to any one or more of the following Examples 1-24:

1. An imprint composition, comprising: a plurality of passivated nanoparticles, wherein each passivated nanoparticle comprises a core and a shell, wherein the core comprises a metal oxide, and wherein the shell comprises a passivation material; one or more solvents; a surface ligand; an additive; and an acrylate.
2. An imprint composition, comprising: a plurality of passivated nanoparticles, wherein: each passivated nanoparticle comprises a core and a shell; the core comprises a metal oxide; the shell comprises a passivation material; and the passivation material comprises an atomic layer deposition (ALD) material, a block copolymer, or a silicon-containing compound; one or more solvents; a surface ligand; an additive; and an acrylate.
3. The imprint composition according to Example 1 or 2, wherein the core comprises titanium oxide, niobium oxide, zirconium oxide, hafnium oxide, dopants thereof, or any combination thereof.
4. The imprint composition according to any one of Examples 1-3, wherein the passivation material of the shell comprises an ALD material.
5. The imprint composition according to any one of Examples 1-4, wherein the ALD material is selected from silicon oxide, zirconium oxide, hafnium oxide, aluminum oxide, tantalum oxide, niobium oxide, nickel oxide, cobalt oxide, tungsten oxide, vanadium oxide, cerium oxide, tin oxide, indium oxide, hafnium zirconium oxide, hafnium titanium oxide, titanium zirconium oxide, silicon titanium oxide, silicon nitride, titanium nitride, aluminum titanium oxide, a dopant thereof, or any combination thereof, and wherein the core and the shell comprise different materials.
6. The imprint composition according to any one of Examples 1-5, wherein the passivation material of the shell comprises a block copolymer.
7. The imprint composition according to any one of Examples 1-6, wherein the block copolymer comprises polystyrene-block-poly(4-vinylpyridine) (PS-b-P4VP), polystyrene b-polyethylene oxide (PS-b-PEO), polystyrene-b-polybutadiene (PS-b-PB), polystyrene b-polymethylmethacrylate (PS-b-PMMA), polystyrene-block-polybutadiene-block-poly-styrene, a poloxamer, poly(isoprene-block-dimethylaminoethyl methacrylate) (PI-b-PDMAEMA), poly(ethylene oxide)-poly(propylene oxide)-poly(ethylene oxide) (PEO-PPO-PEO), a polymer thereof, or any combination thereof.
8. The imprint composition according to any one of Examples 1-7, wherein the passivation material of the shell comprises a silicon-containing compound, and wherein the silicon-containing compound comprises a silane, a silanol, a siloxane, a silicone, or any combination thereof.
9. The imprint composition according to any one of Examples 1-8, wherein the silicon-containing compound comprises (3-acetamidopropyl)trimethoxysilane, octeyltriethoxy silane, octeyltrimethoxy silane, 3-(trimethoxysilyl)propyl methacrylate, propyltriethoxy silane, (3-acryloxypropyl)tris(trimethylsiloxy) silane, dimethyldiethoxysilane, polydimethylsiloxane, γ-glycidoxypropyltrimethoxy-silane (GPMS), polydiphenylsiloxane, hexamethylcyclotrisiloxane, aminopropyltriethoxysilane, a complex thereof, or any combination thereof.
10. The imprint composition according to any one of Examples 1-9, wherein the core has a diameter of about 2 nm to about 50 nm.
11. The imprint composition according to any one of Examples 1-10, wherein the shell has a thickness of about 0.1 nm to about 40 nm.
12. A method of forming a nanoimprint film, comprising: disposing an imprint composition comprising a plurality of passivated nanoparticles on a substrate, wherein: each passivated nanoparticle comprises a core and a shell; the core comprises a metal oxide; the shell comprises a passivation material; and the passivation material comprises an ALD material, a block copolymer, or a silicon-containing compound, and wherein the silicon-containing compound comprises a silane, a silanol, a silicone, a siloxane, derivatives thereof, or any combination thereof; contacting the imprint composition with a stamp having a pattern; converting the imprint composition to a porous nanoimprint film; and removing the stamp from the porous nanoimprint film.
13. The method according to Example 12, wherein the core comprises titanium oxide, niobium oxide, zirconium oxide, hafnium oxide, a dopant thereof, or any combination thereof.
14. The method according to Example 12 or 13, wherein the passivation material of the shell comprises the ALD material.
15. The method according to any one of Examples 12-14, wherein the ALD material is selected from silicon oxide, zirconium oxide, hafnium oxide, aluminum oxide, tantalum oxide, niobium oxide, nickel oxide, cobalt oxide, tungsten oxide, vanadium oxide, cerium oxide, tin oxide, indium oxide, hafnium zirconium oxide, hafnium titanium oxide, titanium zirconium oxide, silicon titanium oxide, silicon nitride, titanium nitride, aluminum titanium oxide, a dopant thereof, or any combination thereof, and wherein the core and the shell comprise different materials.
16. The method according to any one of Examples 12-15, wherein the passivation material of the shell comprises the block copolymer.
17. The method according to any one of Examples 12-16, wherein the block copolymer comprises polystyrene-block-poly(4-vinylpyridine) (PS-b-P4VP), polystyrene b-polyethylene oxide (PS-b-PEO), polystyrene-b-polybutadiene (PS-b-PB), polystyrene b-polymethylmethacrylate (PS-b-PMMA), polystyrene-block-polybutadiene-block-polystyrene, a poloxamer, poly(isoprene-block-dimethylaminoethyl methacrylate) (PI-b-PDMAEMA), poly(ethylene oxide)-poly(propylene oxide)-poly(ethylene oxide) (PEO-PPO-PEO), a polymer thereof, or any combination thereof.
18. The method according to any one of Examples 12-17, wherein the passivation material of the shell comprises the silicon-containing compound.
19. The method according to any one of Examples 12-18, wherein the silicon-containing compound comprises (3-acetamidopropyl)trimethoxysilane, octeyltriethoxy silane, octeyltrimethoxy silane, 3-(trimethoxysilyl)propyl methacrylate, propyltriethoxy silane, (3-acryloxypropyl)tris(trimethylsiloxy)silane, dimethyldiethoxysilane, polydimethylsiloxane, γ-glycidoxypropyltrimethoxy-silane (GPMS), polydiphenylsiloxane, hexamethylcyclotrisiloxane, aminopropyltriethoxysilane, a complex thereof, or any combination thereof.

20. The method according to any one of Examples 12-19, wherein the core has a diameter of about 2 nm to about 50 nm.

21. The method according to any one of Examples 12-20, wherein the shell has a thickness of about 0.1 nm to about 40 nm.

22. The method according to any one of Examples 12-21, wherein converting the imprint composition to the imprint material further comprises exposing the imprint composition to a light source having a wavelength of about 300 nm to about 365 nm.

23. The method according to any one of Examples 12-22, wherein converting the imprint composition to the imprint material further comprises heating the imprint composition to a temperature of about 50° C. to about 60° C. for a time period of about 1 minute to about 15 minutes.

24. An imprint composition prepared, made, or otherwise formed by the method according to any one of Examples 12-23.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise, whenever a composition, an element, or a group of elements is preceded with the transitional phrase "comprising", it is understood that the same composition or group of elements with transitional phrases "consisting essentially of", "consisting of", "selected from the group of consisting of", or "is" preceding the recitation of the composition, element, or elements and vice versa, are contemplated.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. An imprint composition, comprising:

a plurality of passivated nanoparticles, wherein:

each passivated nanoparticle comprises a core and a shell;

the core comprises a metal oxide;

the shell comprises a passivation material comprising a silicon-containing compound, and wherein the silicon-containing compound comprises (3-acetamidopropyl)trimethoxysilane, octeyltriethoxy silane, ocetyltrimethoxy silane, (3-acryloxypropyl)tris(trimethylsiloxy)silane, dimethyldiethoxysilane, y-glycidoxypropyltrimethoxy-silane (GPMS), 3-(trimethoxysilyl)propylmethacrylate, polydiphenylsiloxane, hexamethylcyclotrisiloxane, a complex thereof, or any combination thereof; and the shell has a thickness of about 0.1 nm to about 50 nm;

one or more solvents;

a surface ligand;

an additive; and an acrylate.

2. The imprint composition of claim 1, wherein the silicon-containing compound comprises (3-acetamidopropyl)trimethoxysilane.

3. The imprint composition of claim 1, wherein the silicon-containing compound comprises (3-acryloxypropyl) tris(trimethylsiloxy) silane.

4. The imprint composition of claim 1, wherein the silicon-containing compound comprises y-glycidoxypropyltrimethoxy-silane (GPMS).

5. The imprint composition of claim 1, wherein the silicon-containing compound comprises 3-(trimethoxysilyl) propyl methacrylate.

6. The imprint composition of claim 1, wherein the silicon-containing compound comprises octeyltriethoxy silane, ocetyltrimethoxy silane, dimethyldiethoxysilane, a complex thereof, or any combination thereof.

7. The imprint composition of claim 1, wherein the silicon-containing compound comprises, polydiphenylsiloxane, hexamethylcyclotrisiloxane, a complex thereof, or any combination thereof.

8. The imprint composition of claim 1, wherein each passivated nanoparticle has a spherical or oval geometry.

9. The imprint composition of claim 1, wherein the core comprises titanium oxide, niobium oxide, zirconium oxide, hafnium oxide, dopants thereof, or any combination thereof.

10. The imprint composition of claim 1, wherein the core has a diameter of about 2 nm to about 50 nm.

11. The imprint composition of claim 10, wherein the shell has a thickness of about 1 nm to about 25 nm.

12. An imprint composition, comprising:

a plurality of passivated nanoparticles, wherein:

each passivated nanoparticle comprises a core and a shell, and has a spherical or oval geometry;

the core comprises a metal oxide;

the shell comprises a passivation material comprising a silicon-containing compound, and wherein the silicon-containing compound comprises (3-acetamidopropyl)trimethoxysilane, octeyltriethoxy silane, ocetyltrimethoxy silane, (3-acryloxypropyl)tris(trimethylsiloxy)silane, dimethyldiethoxysilane, y-glycidoxypropyltrimethoxy-silane (GPMS), 3-(trimethoxysilyl)propylmethacrylate, polydiphenylsiloxane, hexamethylcyclotrisiloxane, a complex thereof, or any combination thereof;

one or more solvents;

a surface ligand;

an additive; and an acrylate.

13. The imprint composition of claim 12, wherein the silicon-containing compound comprises (3-acetamidopropyl)trimethoxysilane.

14. The imprint composition of claim 12, wherein the silicon-containing compound comprises (3-acryloxypropyl) tris(trimethylsiloxy)silane.

15. The imprint composition of claim 12, wherein the silicon-containing compound comprises y-glycidoxypropyltrimethoxy-silane (GPMS).

16. The imprint composition of claim 12, wherein the silicon-containing compound comprises 3-(trimethoxysilyl) propyl methacrylate.

17. The imprint composition of claim 12, wherein the silicon-containing compound comprises octeyltriethoxy silane, ocetyltrimethoxy silane, a complex thereof, or any combination thereof.

18. The imprint composition of claim 12, wherein the silicon-containing compound comprises polydiphenylsiloxane, hexamethylcyclotrisiloxane, a complex thereof, or any combination thereof.

19. The imprint composition of claim 12, wherein the core comprises titanium oxide, niobium oxide, zirconium oxide, hafnium oxide, dopants thereof, or any combination thereof, and wherein the core has a diameter of about 2 nm to about 50 nm.

20. An imprint composition, comprising:

a plurality of passivated nanoparticles, wherein:

each passivated nanoparticle comprises a core and a shell;

the core comprises a metal oxide;

the core has a diameter of about 2 nm to about 50 nm; and the shell comprises a passivation material comprising (3-acetamidopropyl)trimethoxysilane, octeyltriethoxy silane, ocetyltrimethoxy silane, 3-(trimethoxysilyl)propyl methacrylate, (3-acryloxypropyl)tris(trimethylsiloxy)silane, y-glycidoxypropyltrimethoxy-silane (GPMS), polydiphenylsiloxane, hexamethylcyclotrisiloxane, a complex thereof, or any combination thereof;

one or more solvents;

a surface ligand; and an additive.

* * * * *